United States Patent

Fukuda et al.

Patent Number: 6,030,449
Date of Patent: Feb. 29, 2000

[54] GARNET SINGLE CRYSTAL FOR SUBSTRATE OF MAGNETO-OPTIC ELEMENT AND METHOD OF MANUFACTURING THEREOF

[75] Inventors: Tsuguo Fukuda, Sendai; Norio Takeda, Tokyo, both of Japan

[73] Assignee: Mitsubishi Gas Chemical Company, Inc., Tokyo, Japan

[21] Appl. No.: 08/868,888

[22] Filed: Jun. 4, 1997

[30] Foreign Application Priority Data

Jun. 14, 1996 [JP] Japan ................................ 8-153922

[51] Int. Cl.$^7$ .......................... C30B 15/00; C30B 19/00; C30B 29/28; C01F 17/00
[52] U.S. Cl. ........................ 117/13; 117/54; 117/945; 423/263
[58] Field of Search ........................ 423/263; 117/945, 117/937, 54, 13; 252/519.1, 521.1, 519.15

[56] References Cited

PUBLICATIONS

Kochurikhin, et al., "The investigation of ions distribution in . . . garnet single crystals" Nippon Kessho Seicho Gakkaishi, 23(3), p. 203, Jul. 1996.

Kochurikhin, et al., "The investigation of ions distribution in . . . garnet single crystals" J. Cryst. Growth, 178(4), pp. 645–647, 1997.

Mill, et al., "Unusual coordination numbers of ions in a garnet structure" Sov. Phys. Crystallogr., 18(1), pp. 76–79, Jul. 1973.

*Primary Examiner*—Steven Bos
*Attorney, Agent, or Firm*—Sughrue, Mion, Zinn, Macpeak & Seas, PLLC

[57] ABSTRACT

A garnet crystal for growing a substrate is used in manufacturing a magneto-optic element. The garnet is manufactured by a Czochralski method and has a chemical structure represented by $La_{8-(x+y)}Yb_xGa_yO_{12}$ wherein x has the range $1.0 \leq x \leq 3.0$, y has the range $2.5 \leq y \leq 4.5$, and (x+y) has the range $5.0 \leq (x+y) \leq 6.5$. The garnet crystal is grown from a melt prepared by heating a mixture of gadolinium oxide, ytterbium oxide, and gallium oxide in a crucible, the oxides being mixed together in a weight proportion such that the atomic proportion is La:Yb:Ga=3:p:q wherein p has the range $1.0 \leq p \leq 3.0$ and q has the range $2.0 \leq q \leq 4.5$.

16 Claims, No Drawings

GARNET SINGLE CRYSTAL FOR SUBSTRATE OF MAGNETO-OPTIC ELEMENT AND METHOD OF MANUFACTURING THEREOF

BACKGROUND OF THE INVENTION

1. Field of the Invention

The present invention relates to a garnet crystal for growing a bismuth-substituted rare earth iron garnet single crystal film which is used in optical isolators and optical switches, and more particularly to a garnet crystal substrate which has a large lattice constant and allows solid solution of a large amount of bismuth in a bismuth-substituted rare earth iron garnet single crystal film.

2. Description of Related Art

A bismuth-substituted rare earth iron garnet single crystal (referred to as BIG hereinafter) is an excellent material that exhibits good transparency and large Faraday effect in near infrared region. Single crystal thick films having a thickness of several hundred microns have been practically used as a Faraday rotator in optical isolators and optical switches.

A BIG thick film having a thickness of several hundred microns is usually grown on a non-magnetic garnet substrate by a liquid phase epitaxial method. When growing such a thick BIG film, the BIG film and substrate must be very accurately aligned in lattice constant. A large difference in lattice constant results in defects in crystal structure or cracks in the substrate due to stress.

A garnet substrate for growing a BIG thick film includes an SGGG substrate made of $(CaGd)_3(MgZrGa)_5O_{12}$ having a lattice constant of 1.2497 nm and an NGG substrate made of $Nd_3Ga_5O_{12}$ having a lattice constant of 1.2509 nm. The Faraday effect and lattice constant of a BIG film increase with increasing amount of the bismuth-substitution and there have been demands towards a garnet substrate having an even larger lattice constant. An article in "Journal of Solid State Chemistry VOL. 5(1972), P. 85ff." has reported on a garnet crystal having a large lattice constant. The article reports that garnet phase was observed when a mixture of rare-earth oxide and gallium oxide reacted under solid phase reaction.

In order to manufacture a substrate for growing a bismuth-substituted rare earth iron garnet single crystal film, a single crystal is required which has a diameter greater than one inch without cracks. However, there has been no report on such a single crystal yet.

SUMMARY OF THE INVENTION

A garnet crystal for growing a substrate used in manufacturing a magneto-optic element is manufactured by a Czochralski method and having a chemical structure represented by:

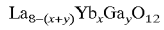

wherein x has the range $1.0 \leq x \leq 3.0$, y has the range $2.5 \leq y \leq 4.5$, and (x+y) has the range $5.0 \leq (x+y) \leq 6.5$.

It is preferable that x has the range $2.1 \leq x \leq 2.5$, y has the range $2.6 \leq y \leq 3.3$, and (x+y) has the range $5.0 \leq (x+y) \leq 5.5$.

The garnet crystal is grown from a melt prepared by heating a mixture of gadolinium oxide, ytterbium oxide, and gallium oxide in a crucible, the oxides being mixed together in a weight proportion such that the atomic proportion is La:Yb:Ga=3:p:q wherein p has the range $1.0 \leq p \leq 3.0$, and q has the range $2.0 \leq q \leq 4.5$.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE INVENTION

The inventors have put in significant efforts in order to develop a garnet crystal for growing a BIG thick film having a large lattice constant, and arrived as the present invention.

The present invention relates to a garnet crystal for growing a magneto-optic element, the garnet crystal being manufactured by Czochralski process and represented by a chemical formula;

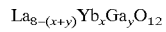

wherein x has the rage $1.0 \leq x \leq 3.0$, $2.5 \leq y \leq 4.5$, and $5.0 \leq (x+y) \leq 6.5$, and more preferably $2.1 \leq x \leq 2.5$, $2.6 \leq y \leq 3.3$, and $5.0 \leq (x+y) \leq 5.5$.

Lanthanum oxide, ytterbium oxide, gallium oxide are sufficiently mixed together in a weight proportion in a crucible such that the atomic proportion is La:Yb:Ga=3:p:q wherein p has the range $1.0 \leq p \leq 3.0$ and $2.0 \leq q \leq 4.5$ and preferably $1.5 \leq p \leq 2.5$ and q has the range $2.5 \leq q \leq 3.5$. Then, the mixture is melted in the crucible and a garnet crystal for growing a substrate is grown from the melt using the Czochralski method. The manufacture of the garnet crystal is carried out in an inert gas atmosphere containing oxygen in the range of preferably from 1% to 5% by volume.

In the present invention, the crucible in which the mixture of the oxides is melted is preferably made of iridium.

According to the present invention, a garnet crystal for growing a substrate for a magneto-optic element is grown by the liquid phase epitaxial (LPE) method and is conveniently used as a substrate for growing a bismuth-substituted rare earth iron garnet single crystal represented by a general formula:

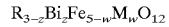

wherein z has the range $0 \leq x \leq 2.0$ and w has the range $0 \leq w \leq 2.0$ and R denotes at least one element selected from the group consisting of Y, La, Ce, Pr, Nd, Sm, Eu, Gd, Tb, Dy, Ho, Er, Tm, Yb, and Lu, and M is at least one element selected from the group of In, Se, Ga, and Al.

Embodiments

The present invention will be described by way of example. Examples 1 and 2 are only exemplary and the present invention is not limited to these examples.

Example 1

A 200 gm mixture of lanthanum oxide ($La_2O_3$), ytterbium oxide ($Yb_2O_3$), gallium oxide ($Ga_2O_3$), all being of a purity of 99.99%, was introduced into an iridium crucible having a diameter of 38 mm and a height of 38 mm. The weight proportion of the oxides was such that the atomic proportion was La:Yb:Ga=3.0:2.0:3.0. Then, a crystal was grown by the Czochralski process in an argon atmosphere containing oxygen of 1.5% by volume. The seed crystal was rotated at a rotational speed of 10 r.p.m. and lifted at a speed of 1.3 mm/hr. The seed crystal was used which is represented by a formula (111) $Gd_3Ga_5O_{12}$. The thus obtained crystal was examined by X-ray diffraction and elementary analysis and found to be a garnet crystal having a crystal composition of $La_{2.79}Yb_{2.30}Ga_{2.91}O_{12}$ and a lattice constant of 1.2761 nm.

Example 2

A crystal was grown in the same way as Example 1 except that a 200 gm mixture of lanthanum oxide ($La_2O_3$), ytterbium oxide ($Yb_2O_3$), gallium oxide ($Ga_2O_3$) was introduced into an iridium crucible having a diameter of 38 mm and a height of 38 mm, all the oxides being of a 99.99% purity. The weight proportion of the oxides was such that the atomic proportion was La:Yb:Ga=3.0:1.8:3.2.

The thus obtained crystal was examined by X-ray diffraction and elementary analysis and found to be a garnet crystal having a crystal composition of $La_{2.63}Yb_{2.12}Ga_{3.25}O_{12}$ and a lattice constant of 1.2737 nm.

As mentioned above, the present invention provides a garnet substrate having a larger lattice constant than a conventional garnet substrate, and allows more amount of bismuth substitution in a bismuth-substituted rare earth iron garnet single crystal manufactured by the liquid phase epitaxial method. As a result, a Faraday rotator having large magneto-optic effect can be obtained which is used in magneto-optic devices such as optical isolators, optical switches, and magneto-optic sensors.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A garnet crystal for growing a substrate used in manufacturing a magneto-optic element, the garnet crystal being manufactured by a Czochralski method and having a chemical formula represented by $$La_{8-(x+y)}Yb_xGa_yO_{12}$$

wherein x has the range $2.1 \leq x \leq 3.0$, y has the range $2.5 \leq y \leq 4.5$, and (x+y) has the range $5.0 \leq (x+y) \leq 6.5$.

2. The garnet crystal according to claim 1, wherein the x has the range $2.1 \leq x \leq 2.5$ the y has the range $2.6 \leq y \leq 3.3$, and (x+y) has the range $5.0 \leq (x+y) \leq 5.5$.

3. The garnet crystal according to claim 1, wherein said garnet crystal is capable of growing a magneto-optic element thereon by a liquid phase epitaxal method, said magneto-optic element having a chemical formula represented by $$R_{3-z}Bi_zFe_{5-w}M_wO_{12}$$

wherein z has the range $0 \leq z \leq 2.0$ and w has the range $0 \leq w \leq 2.0$, R denotes at least one element selected from the group consisting of Y, La, Ce, Pr, Nd, Sm, Eu, Gd, Tb, Dy, Ho, Er, Tm, Yb, and Lu, and M is at least one element selected from the group consisting of In, Sc, Ga, and Al.

4. A method of manufacturing a garnet crystal for growing a substrate which is used for manufacturing a magneto-optic element, comprising:

preparing a mixture of lanthanum oxide, ytterbium oxide, and gallium oxide by mixing the oxides together in a weight proportion such that atomic proportion is La:Yb:Ga=3:p:q wherein p has the range $1.0 \leq p \leq 3.0$ and q has the range $2.0 \leq q \leq 4.5$;

heating said mixture to provide a melt of said mixture; and growing a garnet from said melt of said mixture by Czochralski method; wherein said garnet crystal is of chemical formula represented by $$La_{8-(x+y)}Yb_xGa_yO_{12}$$

wherein x has the range $2.1 \leq x \leq 3.0$, y has the range $2.5 \leq y \leq 4.5$. and (x+y) has the range $5.0 \leq (x+Y) \leq 6.5$.

5. The method according to claim 4, wherein the p has the range $1.5 \leq p \leq 2.5$ and the q has the range $2.0 \leq q \leq 3.5$.

6. The method according to claim 4, wherein the garnet crystal is manufactured in an inert gas atmosphere containing oxygen in the range from 1% to 5% by volume.

7. The method according to claim 4, wherein the x has the range $2.1 \leq x \leq 2.5$, the y has the range $2.6 \leq y \leq 3.3$, and (x+y) has the range $5.0 \leq (x+y) \leq 5.5$.

8. The method according to claim 4, wherein said mixture is heated in a crucible which is made of iridium.

9. A method of making a magneto-optic element by forming on a garnet crystal, by a liquid phase epitaxial method, a magneto-optic element having a chemical formula represented by $$R_{3-z}Bi_zFe_{5-w}M_wO_{12}$$

wherein z has the range $0 \leq z \leq 2.0$ and w has the range $0 \leq w \leq 2.0$, R denotes at least one element selected from the group consisting of Y, La, Ce, Pr, Nd, Sm, Eu, Gd, Tb, Dy, Ho, Er, Tm, Yb, and Lu, and M is at least one element selected from the group consisting of In, Sc, Ga, and Al, said garnet crystal being manufactured by a Czochralski method and having a chemical formula represented by $$La_{8-(x+y)}Yb_xGa_yO_{12}$$

wherein x has the range $2.1 \leq x \leq 3.0$, y has the range $2.5 \leq y \leq 4.5$, and (x+y) has the range $5.0 \leq (x+y) \leq 6.5$.

10. The method according to claim 9, wherein the x has the range $2.1 \leq x \leq 2.5$, the y has the range $2.6 \leq y \leq 3.3$, and (x+y) has the range $5.0 \leq (x+y) \leq 5.5$.

11. The garnet crystal according to claim 1, having a chemical formula represented by $$La_{2.79}Yb_{2.30}Ga_{2.91}O_{12}.$$

12. The garnet crystal according to claim 11, having a lattice constant of 1.2761 nm.

13. The garnet crystal according to claim 1, having a chemical formula represented by $$La_{2.63}Yb_{2.12}Ga_{3.25}O_{12}.$$

14. The garnet crystal according to claim 13, having a lattice constant of 1.2737 nm.

15. The method according to claim 4, wherein the atomic ratio of La:Yb:Ga is 3.0:2.0:3.0.

16. The method according to claim 4, wherein the atomic ratio of La:Yb:Ga is 3.0:1.8:3.2.

* * * * *